(12) United States Patent
Horiuchi et al.

(10) Patent No.: US 7,839,072 B2
(45) Date of Patent: Nov. 23, 2010

(54) TRANSLUCENT LAMINATE SHEET AND LIGHT-EMITTING DEVICE USING THE TRANSLUCENT LAMINATE SHEET

(75) Inventors: Megumi Horiuchi, Fujiyoshida (JP); Toshiro Yukinari, Minamitsuru-gun (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 265 days.

(21) Appl. No.: 11/753,176

(22) Filed: May 24, 2007

(65) Prior Publication Data

US 2007/0273274 A1    Nov. 29, 2007

(30) Foreign Application Priority Data

May 24, 2006  (JP)  ............... 2006-144346
May 31, 2006  (JP)  ............... 2006-152180

(51) Int. Cl.
  *H01J 1/66*   (2006.01)
  *H01J 1/54*   (2006.01)
(52) U.S. Cl. ............... 313/501; 313/498; 313/499; 349/153
(58) Field of Classification Search ............... 313/498, 313/499, 501; 349/153
  See application file for complete search history.

(56) References Cited

U.S. PATENT DOCUMENTS

| 6,653,778 | B1 * | 11/2003 | Tomiuchi et al. | ............ 313/501 |
|---|---|---|---|---|
| 6,858,880 | B2 | 2/2005 | Horiuchi et al. | |
| 6,911,772 | B2 * | 6/2005 | Cok | ............ 313/501 |
| 2003/0160188 | A1 * | 8/2003 | Tazaki | ............ 250/484.4 |
| 2004/0145289 | A1 * | 7/2004 | Ouderkirk et al. | ............ 313/113 |
| 2005/0033015 | A1 * | 2/2005 | Pei | ............ 528/423 |
| 2005/0285507 | A1 * | 12/2005 | Chung et al. | ............ 313/503 |
| 2006/0172148 | A1 * | 8/2006 | Murayama et al. | ............ 428/690 |

FOREIGN PATENT DOCUMENTS

| JP | 2001-220579 | 8/2001 |
|---|---|---|
| JP | 2002-163902 | 6/2002 |
| JP | 2003-081986 | 3/2003 |
| JP | 2004-352928 | 12/2004 |
| JP | 2005-008872 | 1/2005 |
| JP | 2005-252250 | 9/2005 |
| JP | 2006-049657 | 2/2006 |
| WO | WO 2004104136 A1 * | 12/2004 |

* cited by examiner

*Primary Examiner*—Bumsuk Won
*Assistant Examiner*—Nathaniel J Lee
(74) *Attorney, Agent, or Firm*—Browdy and Neimark, PLLC (57) ABSTRACT

A translucent laminate sheet includes at least one type of organic phosphor to make wavelength conversion of light emitted from a light source, and light-transmitting members to seal the organic phosphor.

The light-transmitting members are formed by two plate-like members and the organic phosphor is disposed to be held between the two plate-like members. A frame member is disposed between the two plate-like members, and the organic phosphor is hermetically sealed in a space surrounded by the frame member and the two plate-like members.

12 Claims, 10 Drawing Sheets

Fig. 14

TRANSLUCENT LAMINATE SHEET AND LIGHT-EMITTING DEVICE USING THE TRANSLUCENT LAMINATE SHEET

BACKGROUND OF THE INVENTION

1. Field of the Invention

The present invention relates to a translucent laminate sheet configured to emit white light by means of an organic phosphor and a light-emitting device using the translucent laminate sheet.

2. Description of Related Art

A known example of a conventional light-emitting device comprises an LED (light emitting diode) lamp in which an LED element is mounted on a lead frame or insulative substrate provided with electrodes using an Ag paste and electrically connected to the electrodes by bonding wires, and is thereafter sealed by epoxy resin, silicon resin or the like. In the case of realizing a white-light LED lamp, a blue LED element of a GaN type is mainly used, and the LED lamp is formed by mixing a YAG phosphor in the above-mentioned epoxy resin or the like, so that pseudo white light is emitted by wavelength conversion of light emitted from the blue LED element by the YAG phosphor (for reference, see Japanese Patent Application Publication 2006-49657).

However, because the YAG phosphor is an inorganic phosphor, the wavelength-converted light has a wide spectrum and has poor matching with a liquid crystal color filter, and hence it is difficult to obtain white light having high chromaticness.

In this connection, it is already known in conventional art that addition of a red phosphor to the YAG phosphor in the above-mentioned resin makes it possible to achieve a broader color repeatability. For example, diketone proposed in Japanese Patent Application Publication Nos. 2005-252250 or 2003-81986, or a europium complex, having a ligand of carboxylic acid proposed in Japanese Patent Application Publication 2005-8872 are red emission materials having high emission strength, excellent color rendering properties and excellent color reproducibility.

The complex is sensitive to oxygen or humidity and requires an airtight sealing; in a conventional sealing method, a fluorescent layer is applied to an inner surface of an outer cap in a light-emitting device and an inner portion of the outer cap is set to a vacuum or inert gas ambient atmosphere to achieve the airtight sealing (for reference, see Japanese Patent Application Publication 2004-352928).

However, the above-mentioned proposals do not disclose a light-emitting device which includes a translucent laminate sheet in which an organic phosphor is sealed between two light-transmitting members and in which a position of a light source can be arbitrarily set.

SUMMARY OF THE IN INVENTION

An object of the present invention is to provide a translucent laminate sheet in which white light having high color reproducibility and chromaticness and decreased color variation is obtained by preventing deterioration of an air-tight sealed organic phosphor and to provide a light-emitting device using the translucent laminate sheet.

To accomplish the above object, a translucent laminate sheet according to one embodiment of the present invention includes at least one type of organic phosphor to make wavelength conversion of light emitted from a light source and light-transmitting members to seal the organic phosphor.

The light-transmitting members are formed by, for example, two glass plates and disposed to hold the organic phosphor therebetween.

The two glass plates are adhered at circumferences thereof by a sealing material, and the organic phosphor is hermetically sealed in a space surrounded by the two glass plates and the sealing material.

A light-emitting device according to the present invention includes a substrate, a light source mounted on the substrate and electrically connected to the substrate, and a translucent laminate sheet disposed above the substrate and configured to receive light emitted from the light source.

The translucent laminate sheet used in the light-emitting device includes at least one type of organic phosphor to make wavelength conversion of light emitted from the light source and light-transmitting members to seal the organic phosphor.

Because the organic phosphor in the translucent laminate sheet according to the present invention is hermetically sealed in the light-transmitting members, there is less deterioration in the organic phosphor and the initial characteristics can be maintained over a long period.

Also, because the light-emitting device uses the translucent laminate sheet in which the organic phosphor is hermetically sealed to make the wavelength conversion of the light emitted from the light source, it is possible to achieve white light having high color reproducibility and chromaticness, and decreased color variation, and the white light can be used as lamp light for various displays and illumination.

DETAILED DESCRIPTION OF THE PREFERRED EMBODIMENTS

Preferred embodiments of the present invention will be explained in detail with reference to the accompanying drawings.

FIGS. 1 to 4 illustrate a first embodiment of a light-emitting device according to the present invention and a translucent laminate sheet used in the light-emitting device.

Figure 1:
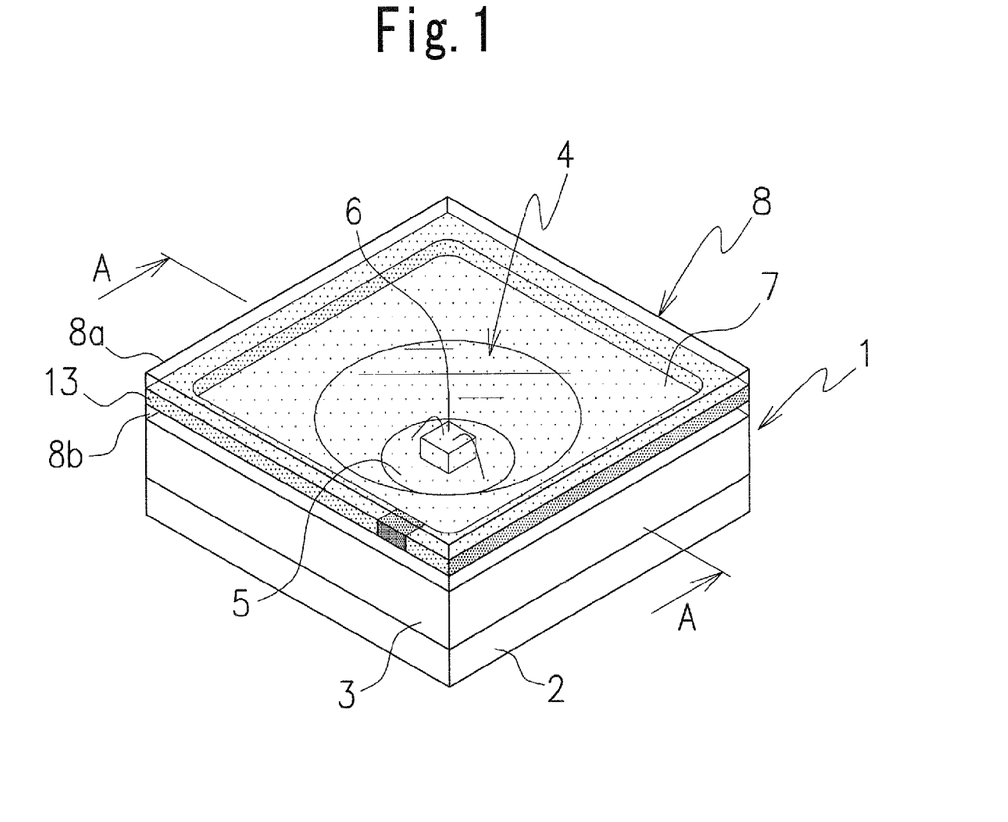
FIG. 1 is a perspective view showing a light-emitting device according to a first embodiment of the present invention.
Figure 2:
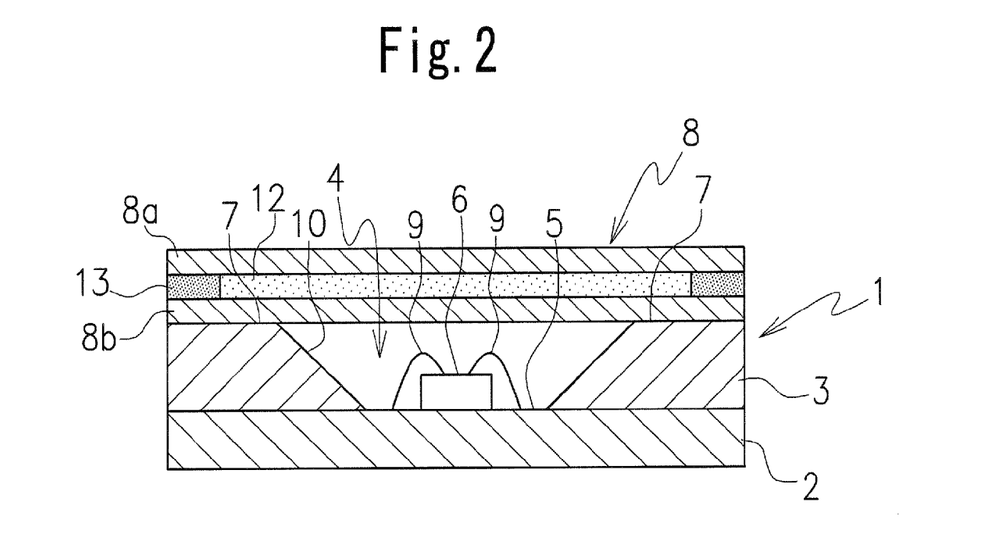
FIG. 2 is a sectional view taken along the line A-A of FIG. 1.
Figure 3:
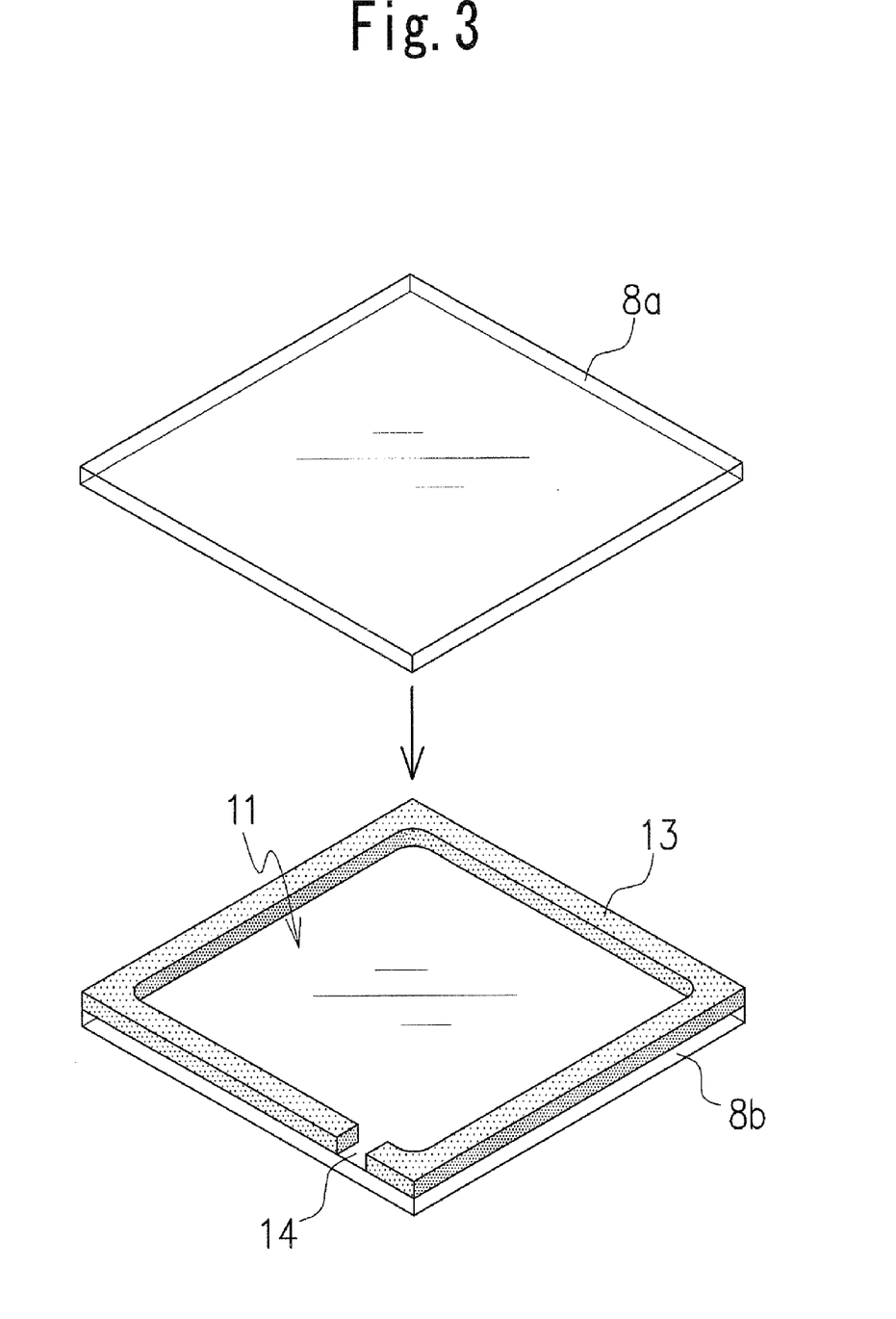
FIG. 3 is an exploded perspective view of a translucent laminate sheet used in the light-emitting device.
Figure 4:
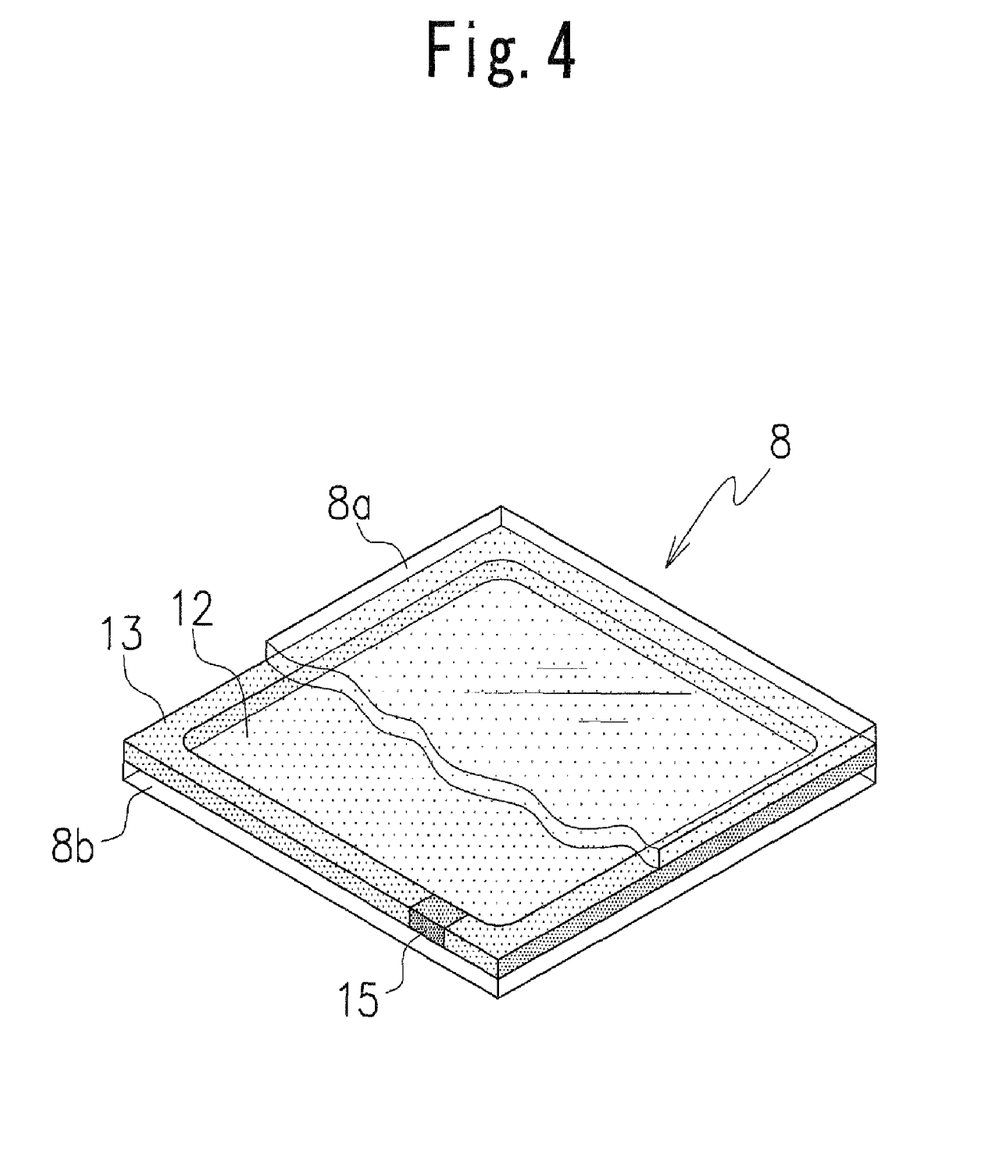
FIG. 4 is a partially broken perspective view of the translucent laminate sheet.

The light-emitting device 1 in the first embodiment includes a square flat-plate substrate 2, a reflection frame 3 having a concave portion 4 with an inverted conical shape cross-section and disposed on the substrate 2, a light source, for example, an LED element 6 mounted at a bottom portion a of the concave portion 4 of the reflection frame 3, in other words, on an upper surface of the substrate 2, and a translucent laminate sheet 8 disposed on an upper surface 7 of the reflection frame 3 and configured to cover the area above the concave portion 4, as shown in FIGS. 1 and 2.

The LED element 6 is electrically connected to printed wirings (not shown) provided on the upper surface of the substrate 2 by bonding wires 9.

The reflection frame 3 comprises, for example, an MID (Molded Interconnect Device) substrate, preferably, a molded substrate made of a ceramic material of alumina or the like. The reflection frame 3 has an upwardly widening reflection surface 10 formed by a tapered inner peripheral surface of the concave portion 4.

It should be noted that the reflection frame 3 may be formed integrally with the substrate 2.

The translucent laminate sheet 8 includes at least one type of organic phosphor 12 to make wavelength conversion of light emitted from the LED element 6 and light-transmitting members to seal the organic phosphor 12 (see FIGS. 1 and 2). In this embodiment, two light-transmitting members, for example, two transparent glass plates 8a and 8b having the same shape are disposed to seal the organic phosphor 12. Each of the glass plates 8a and 8b has a planar shape approximately the same as that of the reflection frame 3.

The translucent laminate sheet 8 is disposed on the reflection frame 3 in such a manner that a circumferential portion of the translucent laminate sheet 8 is placed on an upper surface 7 surrounding the concave portion 4 of the reflection frame 3 to cover the concave portion 4 of the reflection frame 3.

Provided between the two glass plates 8a and 8b is a space 11 which is filled with an organic phosphor 12. The space 11 is formed by the two glass plates 8a and 8b and a frame member 13 disposed between the glass plates 8a and 8b to extend along circumferential portions thereof (see FIG. 1). The frame member 13 comprises, for example, a sealing material to hermetically seal or airproof the two glass plates 8a and 8b. The sealing material comprises, for example, a transparent glass paste which is screen-printed to a predetermined thickness at the circumferential portion of one glass plate 8b. After the glass plate 8b is printed, the other glass plate 8a is placed on the glass plate 8b at the printed part thereof. Thereafter, the two glass plates 8a and 8b are adhered by melting the glass paste to form the translucent laminate sheet having an airproofed interior. A thickness of the printed glass paste is preferably about 50 μm to 100 μm. It should be noted that the glass paste is melted at about 400° C. to 600° C.

It should be noted also that the translucent laminate sheet may be formed by making a seal frame of a predetermined shape from, for example, a transparent glass instead of the above-mentioned glass paste, clipping the seal frame between the two glass plates 8a and 8b, and adhering the two glass plates 8a and 8b using an epoxy resin-type adhesive, silicon resin-type adhesive or the like.

The space 11 formed between the glass plates 8a, 8b and the frame member 13 is airproofed and has a uniform width throughout its entire region. The space 11 is filled with an organic phosphor 12 (see FIG. 1). In order to preserve airtightness when filling the space 11, it is desirable that the space 11 is filled with the organic phosphor 12 in a state where concentration of oxygen gas is kept at 100 ppm, and preferably kept at 20 ppm or less in a vacuum or ambient atmosphere of an inert gas such as nitrogen, argon or the like.

The frame member 13 to hermetically seal the organic phosphor 12 between the two glass plates 8a and 8b is provided with at least one inlet 14 (see FIG. 3) in one place thereof which is formed by a portion where the glass paste is not printed, at the time that the glass paste is printed. The inlet 14 is used to fill the space 11 with a paste-like organic phosphor 12. After the space 11 is filled with the organic phosphor 12, a closing portion 15 is formed by solder or ultra violet curable resin (see FIG. 4). When the inlet 14 is closed by solder, it is preferable that a Sn-type low melting solder having a melting point of about 110 to 140° C., which is lower than the heat resistance of the organic phosphor 12 contained inside, is used.

The two glass plates 8a and 8b may be made of the same material or of different materials. However, it is required that the two glass plates transmit light within the visible light region. For example, it is desirable that a transmission factor of the two glass plates in a visible light region of 400 nm or more be greater than or equal to 80%, or even 85%. Also, a transmission factor of the two glass plates in a near-ultraviolet region of 350 nm or less should preferably be less than or equal to 40%.

It is desirable that the glass plates be of a high strength. It is preferable that the glass plates have, for example, a Young's modulus of 50 to 80 MPa, a density of 2 to 3 g/cm$^3$, a refraction index of 1.4 to 1.6, and a softening point of 600 to 1600° C.

As a material of the glass plates 8a and 8b, for example, a white plated glass, a high silicate glass, a zinc borate silicate glass, or the like may be used. For a white plated glass, it is preferable to use it with a composition including 60 to 80% of $SiO_2$, 1 to 5% of $Al_2O_3$, 2 to 5% of $B_2O_3$, and with a total of 20 to 30% of $Na_2O$, $K_2O$ and CaO. For a high silicate glass, it is preferable to use it with a composition including not less than 80% of $SiO_2$, or even 90% or more of. For a zinc borate silicate glass, it is preferable to use it with a composition including 70 to 90% of $SiO_2$ and the reminder of ZnO or the like. It should be noted that, besides the above-mentioned glass plate materials, other plate-shaped materials, for example, various plastic materials or the like having gas-barrier properties may also be used as a material of the light-transmitting members.

Next, the organic phosphor 12 sealed in the light-transmitting members is described.

In this embodiment, an organic fluorescent complex is chiefly used as the phosphor 12. In addition, polymers including various fluorescent materials in their main chain and other such organic phosphors may also be used. Any organic fluorescent complex, preferably a rare-earth ion complex which includes one or two or more types of ligand anions and a trivalent rare-earth element ion can be used. Examples of rare-earth elements include Sm, Eu, Tb, Ey, Tm and the like. In particular, it is preferable to use an ion complex of Eu (europium) element as a red phosphor, Tm (thulium) element as a blue phosphor and Tb (terbium) element as a green phosphor.

Examples of such fluorescent complexes are mentioned in Japanese Patent Application Publication Nos. 2005-8872, 2004-356358, 2004-352928, 2005-41941, 2005-41942, 2005-112923, 2005-252250, 2003-81986 and 2003-147346, Japanese Patent No. 3668966, International Publication Nos. 2004/104136, 2004/107459 and 2005/75598 and the like.

It is particularly desirable to use a europium complex as a red fluorescent complex. Although the present invention can use a polymer including a fluorescent material in its main chain, it is preferable to use a europium complex with a diketone or carboxylic acid ligand as a red phosphor in consideration of emission efficiency. In addition to the red phosphor, the above-mentioned organic phosphor or an inorganic-type phosphor may also be used.

A preferable example of such a complex is, for example, the complex shown by the following chemical structural formula (1) which has a specified β-diketone anion as a ligand.

(1)

In the above-mentioned chemical structural formula (1), p is 1 or 2, and q is 1, 2, 3 or 4. Each of the characters X which may be identical or different represents a hydrogen atom, deuterium atom, halogen atom (fluorine, chlorine, bromine, iodine), a group of carbon number 1 to 20, hydroxyl group, nitro group, amino group, sulfonyl group, cyano group, silyl group, phosphornic acid group, diazo group or mercapto group. Each of the characters Y which may be identical or different represents a group of carbon number 1 to 20, hydroxyl group, nitro group, amino group, sulfonyl group, cyano group, silyl group, phosphornic acid group, diazo group or mercapto group. Z represents a hydrogen atom or deuterium atom.

Concrete examples of the complex represented by the chemical structural formula (1) include the complex compounds shown as the combination of X=H, Y=CF$_3$, Z=H, p=2 and q=3, or as the combination of X=H, Y=CF$_3$, Z=D, p=2 and q=3, and so on.

In the present invention, a known phosphor other than the fluorescent complex may be used as the blue phosphor and the green phosphor which are used together with the europium complex which is the red fluorescent complex. Example of a blue phosphor include the inorganic phosphors ZnS:Ag, Sr$_5$(PO$_4$) 3Cl:Eu, BaMgAl$_{10}$O$_{17}$:Eu, or the like. As an example of a green phosphor, it may include inorganic phosphors such as ZnS:Cu, ZnS:CuAl, BaMgAl$_{10}$O$_{17}$:Eu, Mn, or the like. To emit white light, any combination of the above-mentioned phosphors may be used.

An LED (light emitting diode) element 6 used in the light-emitting device 1 according to the present invention is configured to emit near-ultraviolet light. It is desirable that the LED element 6 has a peak wavelength of emitted light in the range of 360 nm to 470 nm, more particularly in the range of 380 nm to 470 nm.

It is especially preferable to use an LED element having a peak emission wavelength of 405±10 nm. If the peak wavelength lies excessively on the short wavelength side, light deterioration of the organic compound of the complex affected by light easily occurs, and if the peak wavelength lies excessively on the long wavelength side, it is not possible to achieve the light excitation energy required for light emission from the fluorescent complex, and hence the phosphor is unable to emit light. In the case that an LED element emitting near-ultraviolet light is used, provision may be made of a metallic deposited membrane, coating material, frame or the like which acts as a light shielding mechanism and configured to prevent pre-wavelength conversion light from being emitted from a side surface which is a cross-section of the translucent laminate sheet.

Accordingly, in the light-emitting device 1 including the translucent laminate sheet 8 structured as mentioned above, the near-ultraviolet light emitted from the LED element 6 enters a lower surface of the translucent laminate sheet 8, is wavelength-converted by the organic phosphor 12 contained therein and is upwardly emitted from an upper surface of the translucent laminate sheet 8 as white visible light.

Figure 5:
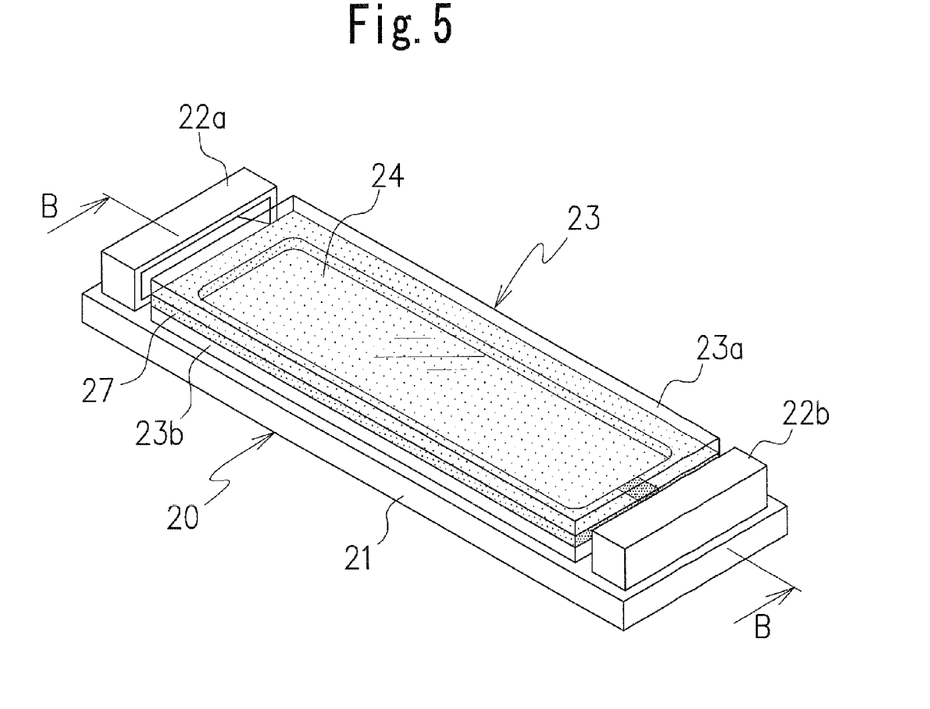
FIG. 5 is a perspective view showing a light-emitting device according to a second embodiment of the present invention.
Figure 6:
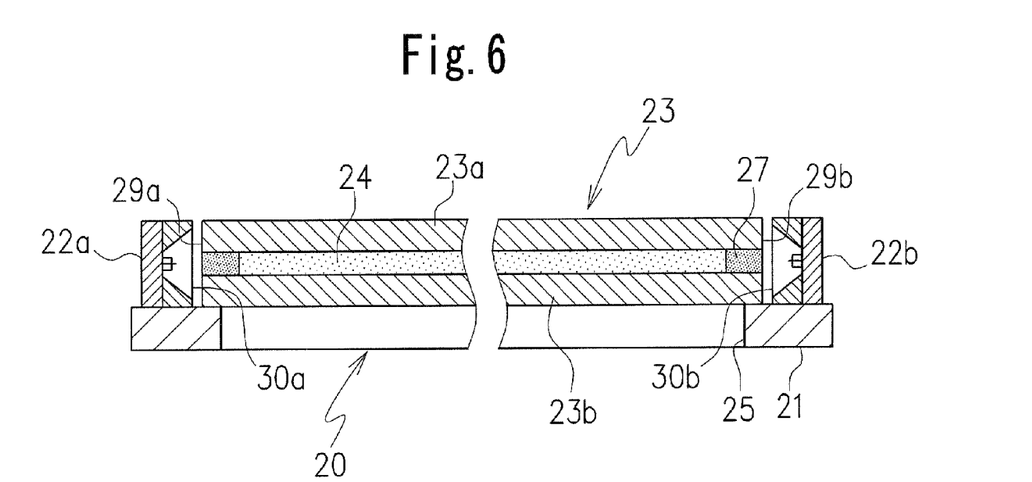
FIG. 6 is a sectional view taken along the line B-B of FIG. 5.
Figure 7:
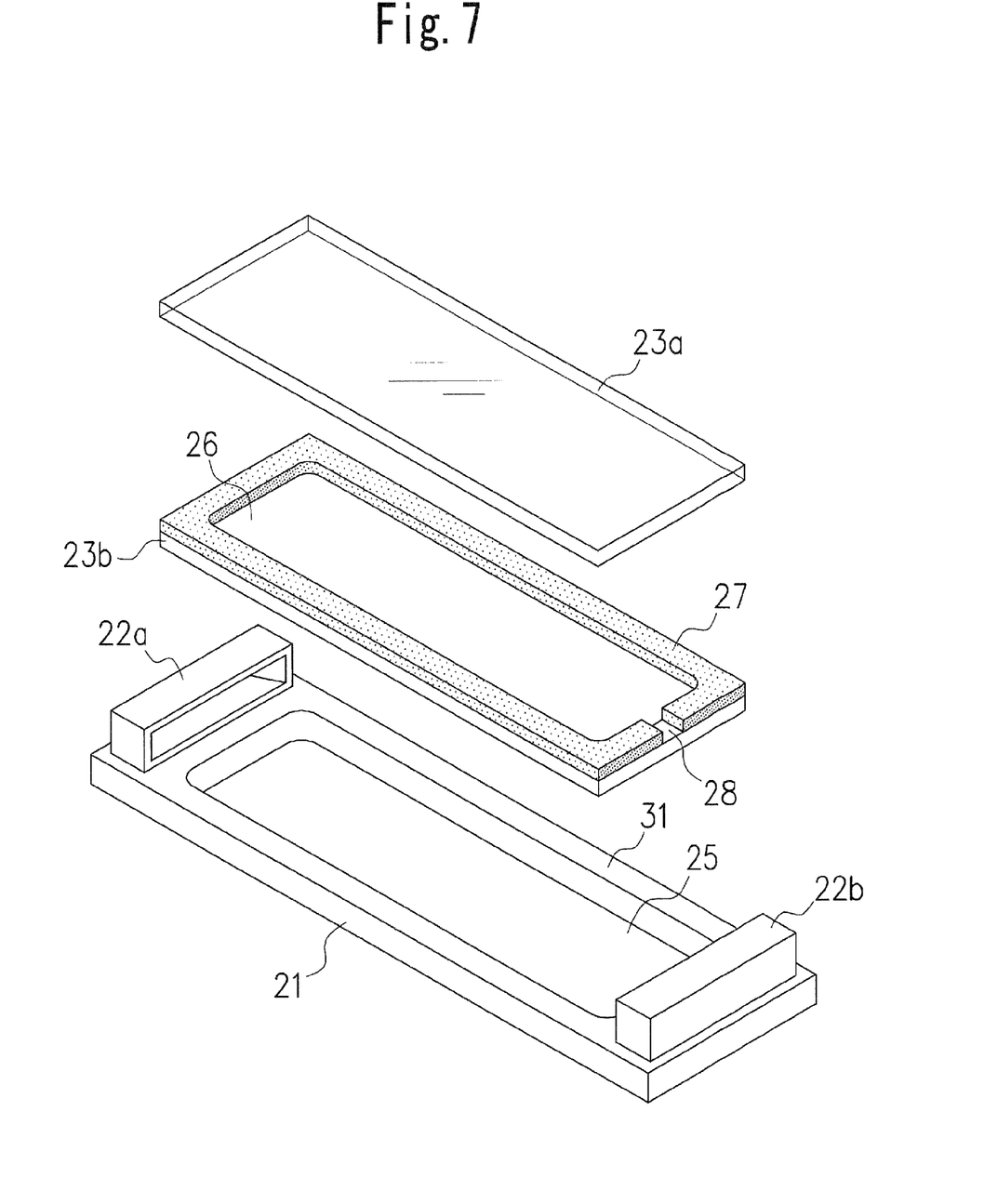
FIG. 7 is an exploded perspective view showing a state before sealing an organic phosphor in a translucent laminate sheet used in the light-emitting device according to the second embodiment.

FIGS. 5 to 7 illustrate a second embodiment of the light-emitting device according to the present invention.

The light-emitting device 20 in this embodiment includes a rectangular frame-like substrate 21, a pair of LEDs 22a and 22b mounted at opposite ends of the substrate 21 in a longitudinal direction, a translucent laminate sheet 23 disposed on the substrate 21 between the pair of LEDs 22a and 22b, and an organic phosphor 24 disposed within the translucent laminate sheet 23.

The substrate 21 is formed as a frame having a large rectangular opening 25 at a central portion thereof (see FIG. 7) and having a supporting surface 31 around the opening 25 upon which the LEDs 22a, 22b and the translucent laminate sheet 23 are disposed.

An arrangement in which the pair of LEDs 22a and 22b are mounted at opposite ends of the substrate 21 is of a transverse-mounted type in which an emission surface of each of the LEDs is disposed to be inwardly directed, that is to say, to face the translucent laminate sheet 23. An LED element (not shown) used in each of the LEDs 22a and 22b is of a type configured to emit near-ultraviolet light, in the same way as in the first embodiment.

The translucent laminate sheet 23 comprises two light-emitting members 23a and 23b of the same shape and at least one type of organic phosphor 24 disposed to be held between the light-transmitting members 23a and 23b, in the same way as in the first embodiment. Each of the light-transmitting members 23a and 23b is made of, for example, a transparent glass plate. The glass plates are formed to be slightly larger in size than the rectangular opening 25 provided in the substrate 21 and are placed on the supporting surface 31 of the substrate 21 about the opening 25, and in this way the translucent laminate sheet 23 is disposed to close the opening 25 of the substrate 21 so that light passing through the opening 25 is emitted from the translucent laminate sheet 23, passing through the light-transmitting member 23b, the organic phosphor 24 and the light-transmitting member 23a.

The translucent laminate sheet 23 also has a space 26 formed between the light-transmitting members 23a and 23b, in the same way as in the first embodiment (see FIG. 7). The space 26 is filled with the organic phosphor 24. The space 26 is formed by the light-transmitting members 23a, 23b and a frame member 27 disposed between the light-transmitting members 23a and 23b. The frame member 27 comprises a sealing material to hermetically seal the light-transmitting members 23a and 23b. The frame member 27 comprises, for example, a glass paste which is screen-printed to a predetermined thickness at the circumferential portion of one light-transmitting member 23b, in the same way as in the first embodiment. After printing of the glass paste, the other light-transmitting member 23a is placed on the glass paste, and the two light-transmitting members 23a and 23b are then bonded by melting and hardening of the glass paste. It should be noted that, instead of using the glass paste, a seal frame made of glass may be disposed between the light-transmitting members 23a and 23b, and the two light-transmitting members 23a and 23b hermetically sealed by using an epoxy resin-type or silicon resin-type adhesive.

The frame member 27 to hermetically seal between the two light-transmitting members 23a and 23b is provided at least one place thereof with an inlet 28 to inject a paste-like organic phosphor 24 in the space 26 (see FIG. 7). Although there is no limitation made on a position of the inlet 28, it is preferable to provide the inlet at a position which avoids a surface facing the light source. It should be noted that the conditions for filling the space 25 with the organic phosphor 24 through the inlet 28, the type of the organic phosphor 24 and the like are the same as in the first embodiment, so that a further detailed description is omitted.

The translucent laminate sheet 23 structured in this way is disposed between the pair of LEDs 22a and 22b (see FIG. 6). Consequently, the translucent laminate sheet 23 is disposed at generally the same level as an emission direction of the LEDs 22a and 22b. Opposite end surfaces of the translucent laminate sheet 23 in its longitudinal direction are disposed to face emission surfaces 30a and 30b of the LEDs 22a and 22b at predetermined intervals as light receiving surfaces 29a and 29b to receive light emitted from the LEDs 22a and 22b.

In the light-emitting device 20 having the above-mentioned structure, the near-ultraviolet light emitted from each of the emission surfaces 30a and 30b of the left and right LEDs 22a and 22b enters the translucent laminate sheet 23 passing through the light receiving surfaces 29a and 29b, is wavelength-converted by the organic phosphor 24 and emitted in an upward and downward direction from the upper and lower light-transmitting members 23a and 23b as white visible light.

Figure 8:
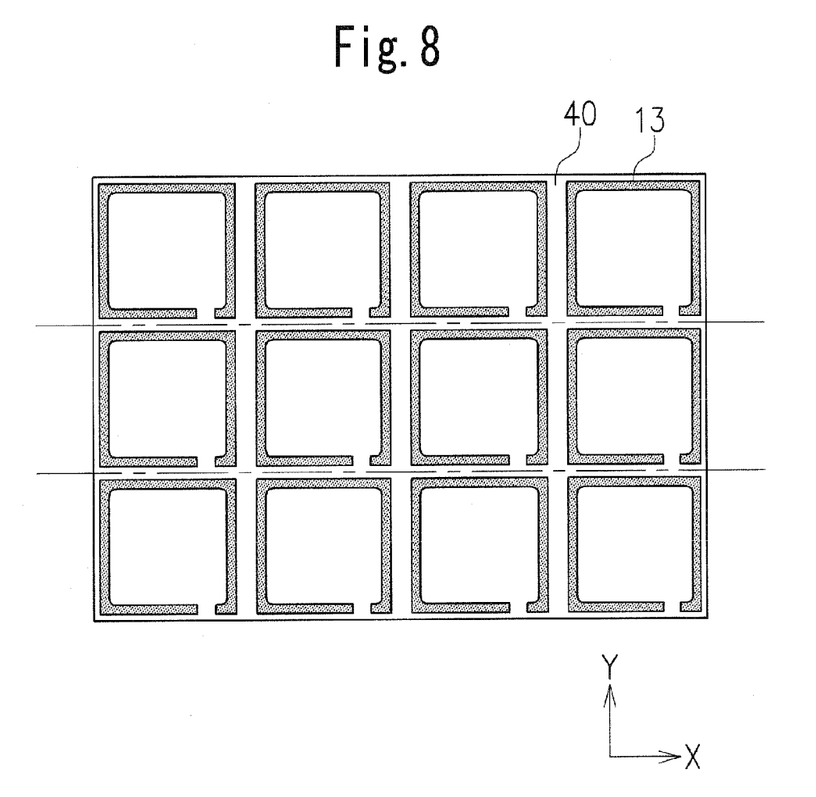
FIG. 8 is a plan view showing a state in which a plurality of frame members are pattern-printed on a glass plates, in a method for producing the translucent laminate sheet according to the first embodiment.
Figure 9:
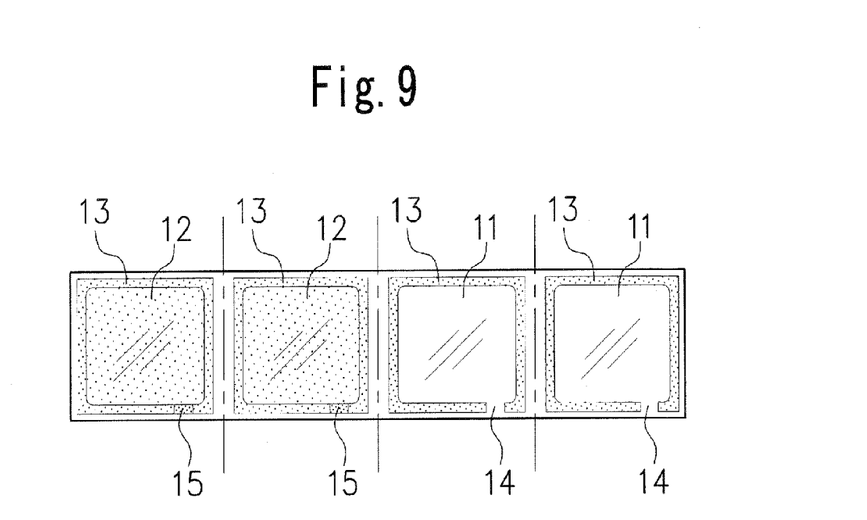
FIG. 9 is a plan view showing one section of two laminated glass plates cut along each of dashed lines of FIG. 8.

FIGS. 8 and 9 illustrate one example of making a plurality of translucent laminate sheets 8 each having the form adopted in the first embodiment of the present invention from large laminated glass plates unit.

As shown in FIG. 8, a plurality of frame members 13 arranged in X and Y directions are first formed on one large rectangular glass plate 40. The frame members 13 can be simultaneously formed by screen-printing a glass paste on the glass plate 40. Another glass plate (not shown) of a generally similar size to that of the glass plate 40 is then placed on the frame members 13 to be laminated on the glass plate 40. The glass paste is then melted so that the two large glass plates are adhered to form a glass plate unit. Subsequently, the glass plate unit is cut in the X direction along the dashed lines as shown in FIG. 8 exposing the inlet 14 of each of the frame members 13, and a rectangular frame member unit is thereby formed (see FIG. 9).

Spaces 11 of the rectangular frame member unit surrounded by the frame members 13 are filled with an organic phosphor. The rectangular frame member unit is cut in the Y direction along the dashed lines after the inlets 14 are sealed by closing members 15 to obtain individual translucent laminate sheets 8, as shown in FIG. 9. In this way, a plurality of translucent laminate sheets 8 can be simultaneously formed from one laminated glass plate unit.

Figure 10:
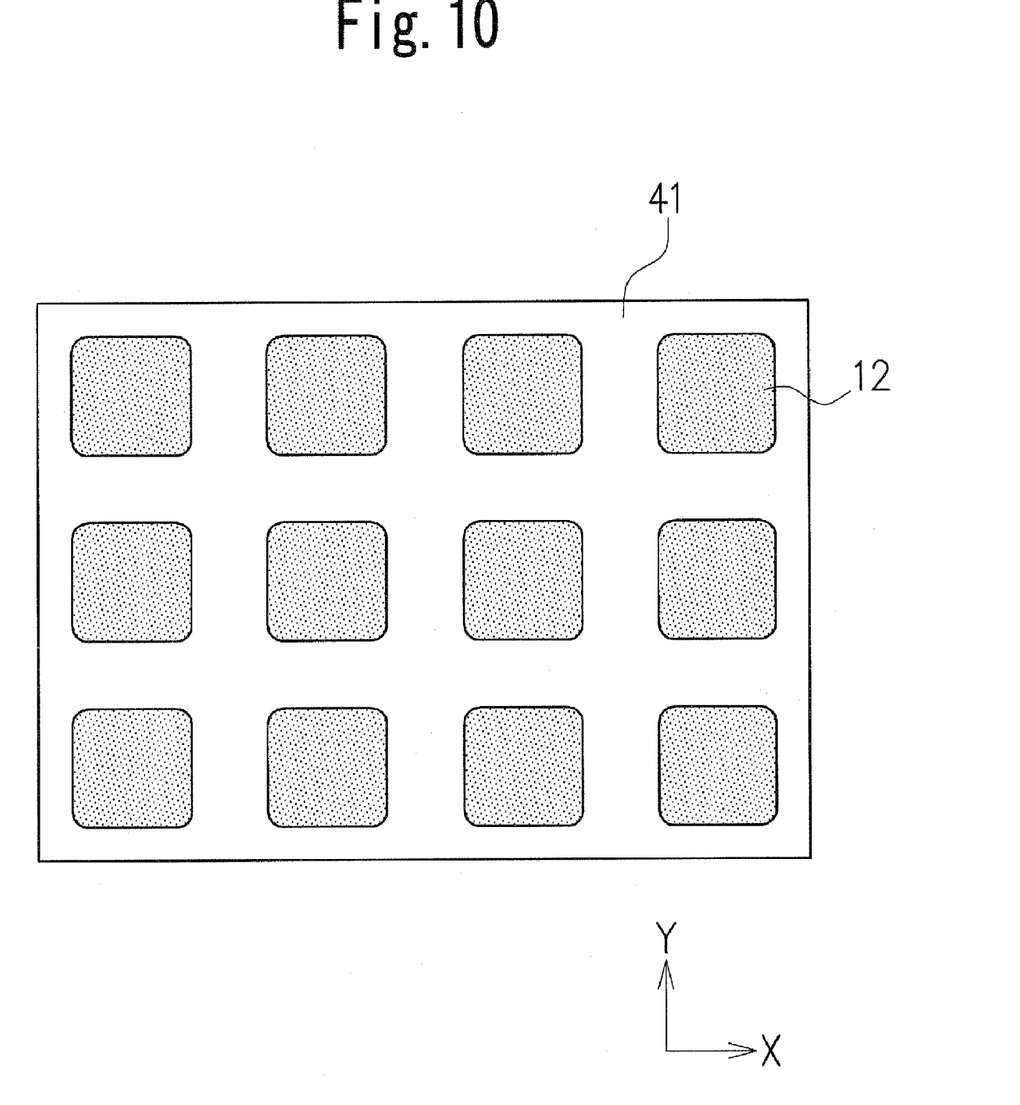
FIG. 10 is a plan view showing a state in which a plurality of organic phosphors portions are pattern-printed on one glass plate, in another method for producing the translucent laminate sheet according to the first embodiment.
Figure 11:
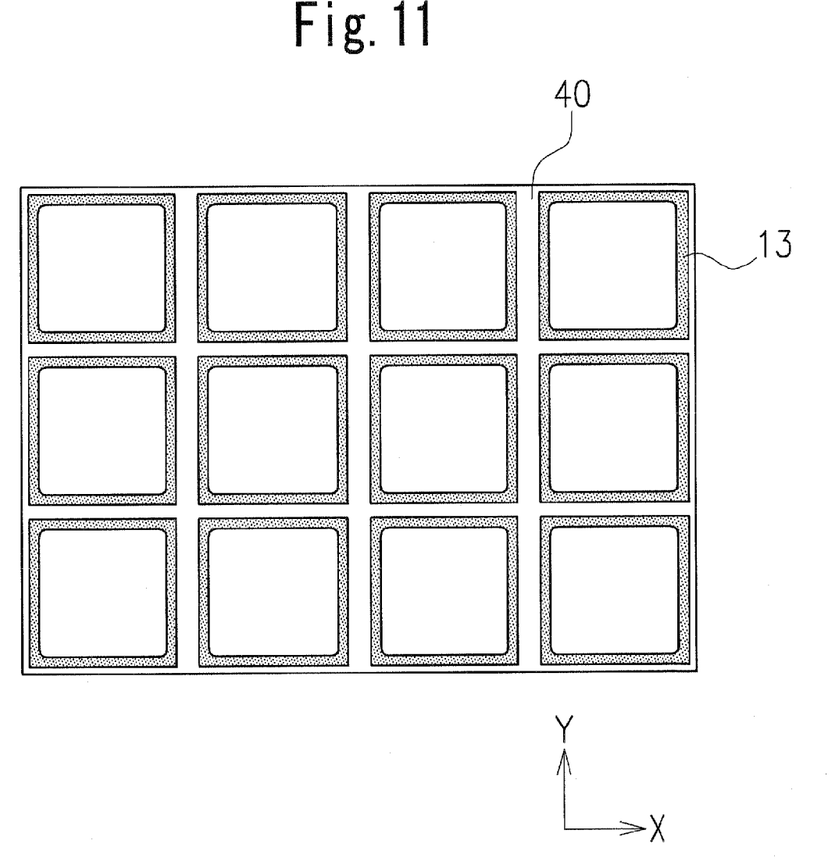
FIG. 11 is a plan view showing a state in which a plurality of frame members are pattern-printed on the other glass plate.
Figure 12:
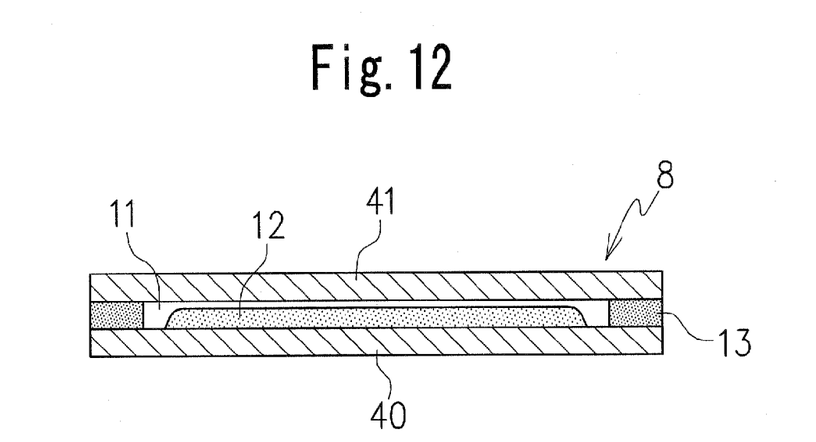
FIG. 12 is a sectional view of the translucent laminate sheet according to the first embodiment, as produced by the other method.

As shown in FIGS. 10 to 12, paste-like organic phosphors 12 may be pattern-formed on one surface of the one glass plate 41 by screen printing or the like, or alternatively, the frame members 13 may be pattern-formed on one surface of the other glass plate 40 by screen printing or the like. In this case, it is not necessary to provide any inlets in the frame members 13.

Subsequently, the two glass plates 40 and 41 are laminated and the frame members 13 are melted so that the glass plates 40 and 41 are adhered.

In this case, the glass plates 40 and 41 are adhered by heating to a temperature in the range of about 120 to 180° C. which lies within the heat resistance range of the organic phosphor 12. Finally, by cutting the glass plates 40 and 41 in the X and Y directions, it is possible to obtain individual translucent laminate sheets 8 in which the spaces 14 formed between the glass plates 40 and 41 are hermetically filled with the organic phosphor 12, as shown in FIG. 12.

Figure 13:
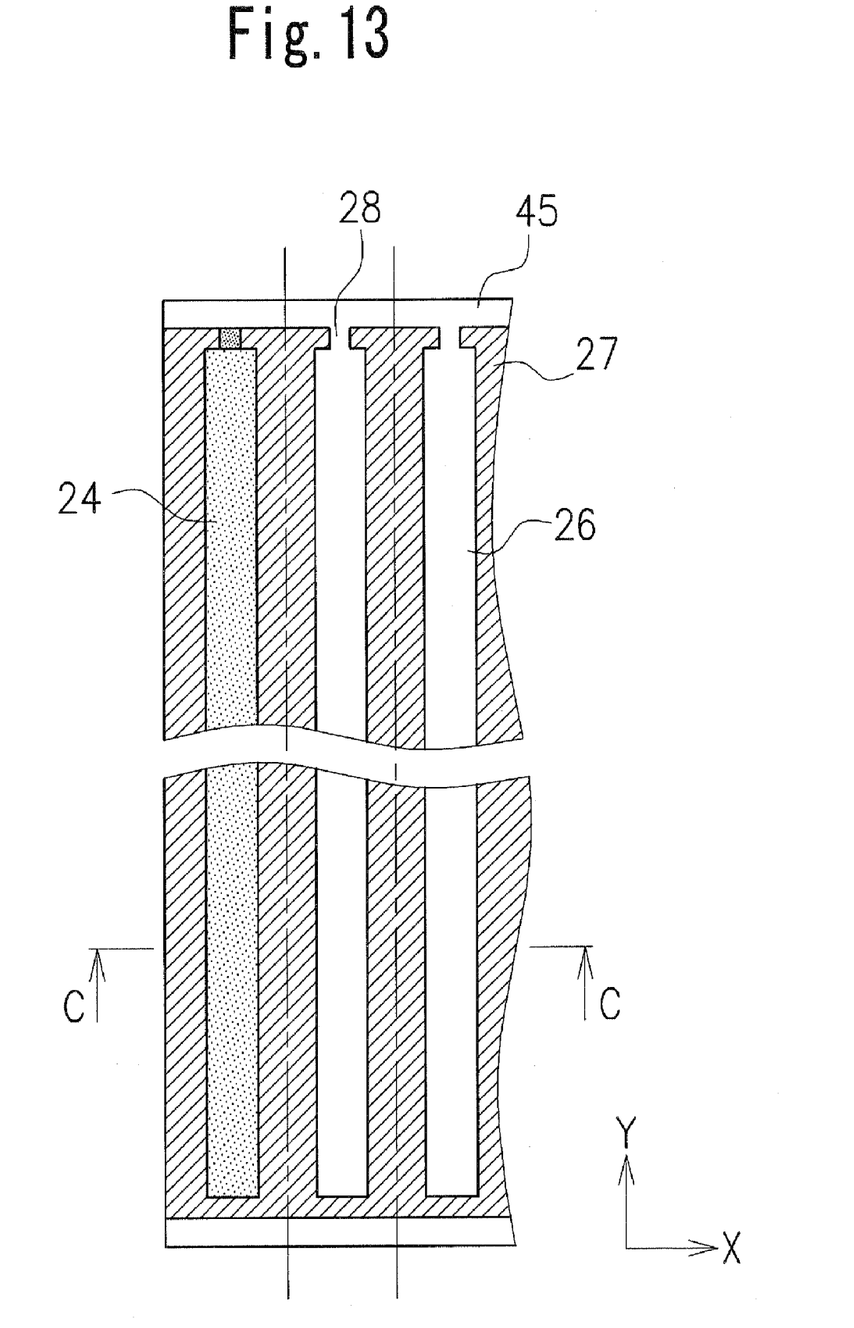
FIG. 13 is a plan view showing a state in which a plurality of frame members are pattern-printed on the glass plates, in the method for producing the translucent laminate sheet according to the second embodiment.
Figure 14:
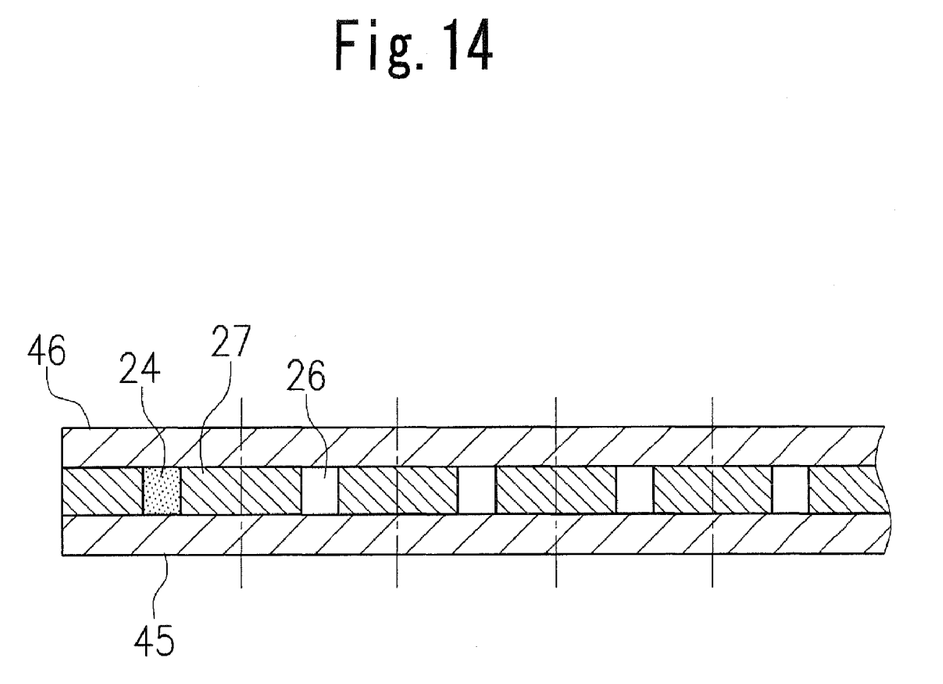
FIG. 14 is a sectional view taken along the line C-C of the two laminated glass plates as shown in FIG. 13.

FIGS. 13 and 14 illustrate a method for producing the translucent laminate sheet 23 according to the second embodiment.

In the production method as shown in this second embodiment, a plurality of translucent laminate sheets 23 are simultaneously produced from one large glass plate unit. Basically, the method is the same as that in the above-mentioned first embodiment.

More specifically, a glass paste is screen-printed on a large rectangular glass plate 45 extending lengthwise in the X direction and a plurality of frame members 27 are pattern-formed on the glass plate in the X direction, as shown in FIG. 13. At this time, an inlet 28 is formed at one end portion of each of the frame members 27 in the Y direction. Next, another glass plate 46 is placed on the glass plate 45 to cover the frame members 27, and the two glass plates 45 and 46 are adhered by melting the glass paste to form the glass plate unit. Next, each of the spaces 26 surrounded by the glass plates 45, 46 and the frame member 27 is filled with the paste-like organic phosphor 24 through the inlet 28, and individual rectangular or linear translucent laminate sheets 23 can be obtained by cutting central portions of the frame members 27 in the Y direction along the dashed lines, after each of the inlets 28 is closed by, for example, solder.

As the method for producing the translucent laminate sheet 23, it is also possible to form the patterned organic phosphors by screen-printing the paste-like organic phosphor on the one glass plate, the patterned frame members by screen-printing on one surface of the other glass plate, and thereafter to laminate and fusion-bond the two glass plates, as mentioned referring to FIGS. 10 to 12. In this way, a plurality of translucent laminate sheets in the second embodiment can also be formed simultaneously from one glass plate unit by a simple method.

Several concrete examples embodying the above-mentioned translucent laminate sheet are explained.

EXAMPLE 1

A translucent laminate sheet was disposed in front of a near-ultraviolet LED, GU35S400T (central wavelength: 400 nm, made by Showa Denko Co., Ltd). A special thin glass plate (white glass plate), D263No. 2 (heat expansion coefficient: $73 \times 10^7/°$ C.) made by Spiegel Glass Company in Germany was used for each of two glass plates in the translucent laminate sheet. More specifically, glass plates each having a size of 5.0 mm×5.0 mm and a thickness of 0.21 mm were used. A paste of the aforementioned europium complex compound [a combination of X=H, Y=CF$_3$, Z=H, p=2, q=3 in the chemical structural equation (1)] was disposed between the glass plates, and the glass plates between which the paste was disposed were fusion-bonded with an Sn-type solder, in a nitrogen atmosphere. A eutectic alloy (melting point: 139° C.) having Bi of 58% by mass, made by Senjyu Kinzoku Co., Ltd, was used as the Sn-type solder.

As a result, red emission light with high color reproducibility was observed.

EXAMPLE 2

Two plates of glass D263 No. 2 (thickness: 0.21 mm) of the aforementioned white glass plate were prepared. The plates of glass were washed by using a water-type cleaning material and then dried by steam. The glass plate planned to be disposed at an upper side was dried at 300° C., after a fritted glass paste has been printed thereon.

A fritted glass paste was printed on the lower glass plate. The above-mentioned printing was executed by screen-printing using a 400 mesh stainless screen plate. The paste has a wet thickness of 10 μm. Part number #4017C, made by Electro-Science Laboratory Co., Ltd., was used for the fritted glass plate.

Next, the upper glass plate and the lower glass plate were laminated to form a unit, which was baked. A gap between the glass plates when laminating the glass plates was set to be 100 μm. The baking was carried out at 100° C. for 30 minutes (with solvent drying), 350° C. for 45 minutes, and 480° C. for 1 hour, taking a total of 3 hours to complete. During this time, a pressure of 20 to 30 g/cm$^2$ was applied. The gap between the glass plates after baking and fusion-bonding the glass plates was 30 μm.

Subsequently, the unit of glass plates was cut into a plurality of rectangular members. That is to say, the unit was cut from two sides thereof in the X direction only using a cutter with a carbide tip. Multiple layer-like depositions of Cr, Ni and Ag were made at the inlets for the complex phosphor paste.

The same complex phosphor as in the first embodiment was used, and the paste was adjusted by dispersing it in a silicate resin. Silicon resin, polyvinyl alcohol or the like may be used as the paste-adjusting material.

Subsequently, the adjusted paste was injected into the spaces through the inlets, heated at about 150° C. and hardened. Thereafter, the inlets were sealed by solder. An Sn-type low melting solder the same as that used in the first embodiment was used for the solder (solder temperature: 139° C., made by Senjyu Metal Co., Ltd). The temperature for the sealing work was about 160° C. Thereafter, the unit of glass plates was cut to obtain single individual translucent laminate sheets. In addition, the single translucent laminate sheets were washed with an ultrasonic washing machine using a cleaning liquid of acetone to clean any dirt generated when injecting the paste and cutting the unit.

Air-tightness of the translucent laminate sheet was checked by means of red liquid. More specifically, the translucent laminate sheet was dipped in the red liquid, and after six hours, the air-tightness was determined by checking the external appearance, thereby providing evidence that the translucent laminate sheet had excellent air-tightness. Furthermore, a light-emitting device was assembled using the translucent laminate sheet, in the same way as in the first embodiment. Red emission light with high color reproducibility was observed.

EXAMPLE 3

In addition to the europium complex compound (red phosphor) in the first embodiment, a paste made of each of BaMgAl$_{10}$O$_{17}$:Eu (blue phosphor) and ZnS:Cu (green phosphor) was used. Apart from the use of an organic phosphor in which a mixture of the blue and green phosphors was dispersed in polyvinyl alcohol, the same operation as in the first embodiment was carried out to produce the translucent laminate sheet. A light-emitting device was assembled by using the translucent laminate sheet, in the same way as in the first embodiment. White emission light with high color reproducibility was observed.

EXAMPLE 4

Two plates of glass D263 (thickness: 0.21 mm) made of a borosilicate glass-type material were prepared, washed using a water-type cleaning material and dried by steam. As shown in FIG. 10, screen-printing was executed on an upper glass plate 41 by using a paste in which the same phosphor as in the first embodiment was dispersed. Thickness of the paste was 100 μm.

The screen print was carried out by using a 350 mesh screen plate made of stainless steel. As shown in FIG. 11, frame members 13 were pattern-printed on a lower glass plate 40 by a screen-printing using a structural bond HC-1413FP (made by Mitsui Kagaku) of an epoxy-type thermal hardening adhesive. Thickness of the frame members was 100 μm. The screen print was carried out by using a 250 mesh screen plate made of stainless steel. After printing, drying was carried out at 90° C. for 10 minutes.

Next, the upper and lower glass plates were laminated to form a unit and baked. The gap between the glass plates when laminating the glass plates was set to be 100 μm. The baking was carried out at 150° C. for 1 hour. During this time, a pressure of 20 to 30 g/cm$^2$ was applied. The gap between the glass plates after baking and fusion-bonding the glass plates was 50 μm.

Subsequently, the unit was cut from two sides thereof in the X and Y directions using a cutter with a carbide tip to obtain single translucent laminate sheets. Thereafter, the paste of the complex phosphor was hardened.

In addition, the single translucent laminate sheets were washed with an ultrasonic washing machine using a cleaning liquid of acetone to clean any dirt generated when injecting the paste and cutting the unit.

Air-tightness of the translucent laminate sheet was checked by means of red liquid. More specifically, the translucent laminate sheet was dipped in the red liquid, and after six hours, the air-tightness was determined by checking the external appearance, thereby providing evidence that the translucent laminate sheet had excellent air-tightness. Furthermore, a light-emitting device was assembled using the translucent laminate sheet, in the same way as in the first embodiment. Red emission light with high color reproducibility was observed.

Although the preferred embodiments of the present invention have been mentioned, the present invention is not limited to these embodiments, and various modifications and changes can be made to the embodiments.

What is claimed is:

1. A light-emitting device, comprising:
   a substrate;
   a light source mounted on the substrate and electrically connected to the substrate; and
   a translucent laminate sheet disposed on the substrate that is the same substrate on which the light source is mounted;
   wherein the translucent laminate sheet comprises: two transparent glass plates; at least one type of organic phosphor to convert wavelength of light emitted from the light source, the at least one type of organic phosphor disposed between the two transparent glass plates; and a frame member disposed between the two transparent glass plates, the frame member extending along circumferential portions of the two transparent glass plates to form a space, the organic phosphor being hermetically sealed in the space, and
   wherein at least one portion of a side surface which is a lamination cross-section of the translucent laminate sheet is a light receiving surface to receive light emitted from the light source, and the side surface of the translucent laminate sheet is covered by a light shielding mechanism, except for the light receiving surface.

2. The light-emitting device according to claim 1, wherein the frame member is a sealing material made from a transparent glass paste.

3. The light-emitting device according to claim 1, wherein the organic phosphor includes one type selected from red-type organic fluorescent complexes.

4. The light-emitting device according to claim 3, wherein the red-type organic fluorescent complex is diketone or a europium complex, having a ligand of carboxylic acid.

5. The light-emitting device according to claim 3, wherein at least one type of phosphor selected from the group consisting of blue-type and green-type phosphor is hermetically sealed together with the red-type organic fluorescent complex.

6. The light-emitting device according to claim 1, wherein the organic phosphor includes at least one type selected from blue-type and/or green-type organic fluorescent complexes.

7. The light-emitting device according to claim 1, wherein the light source includes at least one light emitting diode to emit near-ultraviolet light.

8. The light-emitting device according to claim 1, wherein the frame member is a sealing material made from glass.

9. A light emitting device consisting of:
   (a) a substrate;
   (b) a light source mounted on the substrate and electrically connected to the substrate; and
   (c) a translucent laminate sheet disposed on the substrate;
   (d) wherein the translucent laminate sheet comprises two transparent glass plates;
   (e) at least one type of organic phosphor to convert wavelength of light emitted from the light source;
   (f) the at least one type of organic phosphor disposed between the two transparent glass plates;
   (g) the frame member extending along circumferential portions of the two transparent glass plates to form a space whereby the at least one organic phosphor is hermetically sealed in the space; and
   (h) wherein at least one portion of a side surface which is a lamination cross-section of the translucent laminate sheet is a light receiving surface to receive light from the light source.

10. The light-emitting device according to claim 9, wherein the side surface of the translucent laminate sheet is covered by a light shielding mechanism, except for the light receiving surface.

11. The light emitting device according to claim 9, wherein the organic phosphor includes at least one type selected from the group consisting of red organic fluorescent complexes, blue organic fluorescent complexes, and green organic fluorescent complexes.

12. The light emitting device according to claim 11, wherein the red organic fluorescent complexes comprises a europium complex with a diketone as ligand.

* * * * *